United States Patent
Zhan et al.

(10) Patent No.: US 8,723,770 B2
(45) Date of Patent: May 13, 2014

(54) FLAT PANEL DISPLAY APPARATUS

(75) Inventors: Zhi-Feng Zhan, Yongin (KR);
Seung-Gyu Tae, Yongin (KR);
Sung-Hoon Moon, Yongin (KR);
Deok-Hoi Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 12 days.

(21) Appl. No.: 13/137,478

(22) Filed: Aug. 19, 2011

(65) Prior Publication Data

US 2012/0162050 A1    Jun. 28, 2012

(30) Foreign Application Priority Data

Dec. 23, 2010    (KR) .......................... 10-2010-0133709

(51) Int. Cl.
*G09G 3/36*    (2006.01)

(52) U.S. Cl.
USPC ............................................ 345/87; 349/139

(58) Field of Classification Search
None
See application file for complete search history.

(56) References Cited

U.S. PATENT DOCUMENTS

| 5,724,107 A * | 3/1998 | Nishikawa et al. ............. 349/38 |
| 2003/0020860 A1 | 1/2003 | Hong |
| 2007/0161184 A1* | 7/2007 | Kim et al. ...................... 438/255 |
| 2009/0261336 A1 | 10/2009 | Cho |
| 2010/0065841 A1* | 3/2010 | Lee et al. ......................... 257/43 |

FOREIGN PATENT DOCUMENTS

| KR | 10-2002-0076449 A | 10/2002 |
| KR | 10-2003-0012052 A | 2/2003 |
| KR | 10-2003-0050983 A | 6/2003 |
| KR | 10-2009-0111123 A | 10/2009 |

* cited by examiner

*Primary Examiner* — Seokyun Moon
(74) *Attorney, Agent, or Firm* — Lee & Morse, P.C.

(57) ABSTRACT

A flat panel display apparatus includes a first pixel region on a substrate and defined by an intersection between a first gate line and a data line. The first pixel region includes a first transistor and a first capacitor and is covered by a first pixel electrode. The apparatus includes a second pixel region adjacent to the first pixel region and defined by an intersection between a second gate line and the data line. The second pixel region is covered by a second pixel electrode. The first gate line is positioned between the first pixel electrode and the second pixel electrode. A second capacitor is in the second pixel region, and the second capacitor includes a first transparent conductive layer and a second transparent conductive layer. A transparent shielding portion extends from the second transparent conductive layer of the second capacitor toward the first pixel region to overlap with the first gate line.

15 Claims, 7 Drawing Sheets

FLAT PANEL DISPLAY APPARATUS

CROSS-REFERENCE TO RELATED PATENT APPLICATION

This application claims the benefit of Korean Patent Application No. 10-2010-0133709, filed on Dec. 23, 2010, in the Korean Intellectual Property Office, and entitled "Flat Panel Display Apparatus," the disclosure of which is incorporated herein in its entirety by reference.

BACKGROUND

1. Field

Embodiments relate to a flat panel display apparatus and to a liquid crystal display (LCD) apparatus.

2. Description of the Related Art

Flat panel display apparatuses such as organic light-emitting display apparatuses and liquid crystal display apparatuses include pixel electrodes and gate lines. The gate lines may be arranged on a light path, which may interrupt light emission and reduce an aperture ratio.

SUMMARY

Embodiments may be realized by providing a flat panel display apparatus that includes a first pixel region which is formed on a substrate and is defined by intersection between a first gate line and a data line, the first pixel region including a first transistor and a first capacitor and being covered with a first pixel electrode, and a second pixel region which is formed in adjacent to the first pixel region and is defined by intersection between a second gate line and the data line, the second pixel region being covered with a second pixel electrode. The first gate line is positioned between the first pixel electrode and the second pixel electrode. A second capacitor included in the second pixel region that includes a first transparent conductive layer and a second transparent conductive layer. A transparent shielding portion extends from the second transparent conductive layer of the second capacitor toward the first pixel region to overlap with the first gate line.

The transparent shielding portion may include a shielding portion extending in the same direction as the extending direction of the first gate electrode to overlap with the first gate electrode and a connecting portion extending toward the first pixel region to connect the shielding portion with the second transparent conductive layer.

The first transparent conductive layer, the second transparent conductive layer, and the transparent shielding portion may include at least one selected from a group including indium tin oxide (ITO), indium zinc oxide (IZO), zinc oxide (ZnO), indium oxide ($In_2O_3$), indium gallium oxide (IGO), and aluminum zinc oxide (AZO).

The flat panel display apparatus may further include a second transistor included in the second pixel region and connected with the second pixel electrode. The second transistor may include a semiconductor layer which is formed on the substrate and includes a channel region, a source region, and a drain region, a gate electrode formed on the channel region with a first insulating layer between the gate electrode and the channel region, the gate electrode protruding from the second gate line, and a source electrode and a drain electrode connected with the source region and the drain region by passing through a second insulating layer and a third insulating layer formed on the gate electrode.

An organic layer may be further formed between the source and drain electrodes and the second pixel electrode, and one of the source electrode and the drain electrode may be connected with the second pixel electrode through a via-hole passing through the organic layer.

The second capacitor may further include a capacitor wiring line which is formed of the same material in the same layer as the gate electrode to directly contact the first transparent conductive layer.

The second capacitor may further include a first transparent conductive layer formed on the capacitor wiring line and a second transparent conductive layer formed to correspond to the first transparent conductive layer, with the second insulating layer between second transparent conductive layer and the first transparent conductive layer, and the second transparent conductive layer may be connected with one of the source electrode and the drain electrode of the second transistor.

The capacitor wiring line may include at least one conductive material selected from a group including Ag, Mg, Al, Pt, Pd, Au, Ni, Nd, Ir, Cr, Li, Ca, Mo, Ti, W, MoW, Al/Cu, and Cu.

The first transistor may be connected with the first pixel electrode and include a gate electrode formed to protrude from the first gate line.

The flat panel display apparatus may further include an opposite electrode facing the first pixel electrode and the second pixel electrode in which liquid crystal may be included between the first and second pixel electrodes and the opposite electrodes.

The second capacitor may further include a capacitor wiring line which is formed of the same material in the same layer as the second gate line to directly contact the first transparent conductive layer, and a common voltage may be supplied to the capacitor wiring line.

Embodiments may also be realized by providing a flat panel display apparatus including a first pixel region which is formed on a substrate and is defined by intersection between a first gate line and a data line, the first pixel region covered with a first pixel electrode, and a second pixel region which is formed in adjacent to the first pixel region and is defined by intersection between a second gate line and the data line, the second pixel region being covered with a second pixel electrode. The first gate line is positioned between the first pixel electrode and the second pixel electrode. A first capacitor included in the first pixel region that includes a first transparent conductive layer and a second transparent conductive layer. A transparent shielding portion extends from the second transparent conductive layer of the first capacitor toward the second pixel region to overlap with the first gate line.

The transparent shielding portion may include a shielding portion extending in the same direction as the extending direction of the first gate electrode to overlap with the first gate electrode and a connecting portion extending toward the second pixel region to connect the shielding portion with the second transparent conductive layer.

The first transparent conductive layer, the second transparent conductive layer, and the transparent shielding portion may include at least one selected from a group including indium tin oxide (ITO), indium zinc oxide (IZO), zinc oxide (ZnO), indium oxide ($In_2O_3$), indium gallium oxide (IGO), and aluminum zinc oxide (AZO).

The flat panel display apparatus may further include a first transistor included in the first pixel region and connected with the first pixel electrode. The first transistor may include a semiconductor layer which is formed on the substrate and includes a channel region, a source region, and a drain region, a gate electrode formed on the channel region with a first insulating layer between the gate electrode and the channel region, the gate electrode protruding from the first gate line, and a source electrode and a drain electrode connected with the source region and the drain region by passing through a second insulating layer and a third insulating layer formed on the gate electrode.

An organic layer may be further formed between the source and drain electrodes and the first pixel electrode, and one of the source electrode and the drain electrode may be connected with the first pixel electrode through a via-hole passing through the organic layer.

The first capacitor may further include a capacitor wiring line which is formed of the same material in the same layer as the gate electrode to directly contact the first transparent conductive layer.

The first capacitor may further include a first transparent conductive layer formed on the capacitor wiring line and a second transparent conductive layer formed to correspond to the first transparent conductive layer, with the second insulating layer between second transparent conductive layer and the first transparent conductive layer, and the second transparent conductive layer may be connected with one of the source electrode and the drain electrode of the first transistor.

The capacitor wiring line may include at least one conductive material selected from a group including Ag, Mg, Al, Pt, Pd, Au, Ni, Nd, Ir, Cr, Li, Ca, Mo, Ti, W, MoW, Al/Cu, and Cu.

The flat panel display apparatus may further include an opposite electrode facing the first pixel electrode, in which liquid crystal may be included between the first pixel electrode and the opposite electrode.

The first capacitor may further include a capacitor wiring line which is formed of the same material in the same layer as the first gate line to directly contact the first transparent conductive layer, and a common voltage may be supplied to the capacitor wiring line

BRIEF DESCRIPTION OF THE DRAWINGS

Features will become apparent to those of ordinary skill in the art by describing in detail exemplary embodiments with reference to the attached drawings in which.

DETAILED DESCRIPTION

Example embodiments will now be described more fully hereinafter with reference to the accompanying drawings. The present invention may include several embodiments through various modifications, wherein specific embodiments are exemplified in the accompanying drawings and will be explained in detail. However, it should be understood that the specific embodiments are not limiting and include all modifications, equivalents and substitutions falling within the spirit and technical scope of the present invention. In description, if it is determined that the gist of embodiments becomes vague due to detailed description of related published techniques, the detailed description thereof will be omitted.

Although terms such as "first" and "second" may be used in order to describe a diversity of components, the components should not be limited by the terms. The terms are used only to distinguish one component from the other components.

The terms of this application are used to describe the specific embodiments, but they are not aimed at limiting the embodiments. A singular form includes a plural form as long as the singular form does not clearly indicate a different thing from the plural form. It should be understood that in this application, terms such as "include" or "have" specify existence of a characteristic, a figure, a step, an operation, a component, a part or a combination thereof which are described in the specification but do not previously exclude existence or possibility of addition of one or more different characteristics, figures, steps, operations, components, parts or combinations thereof.

Figure 1:
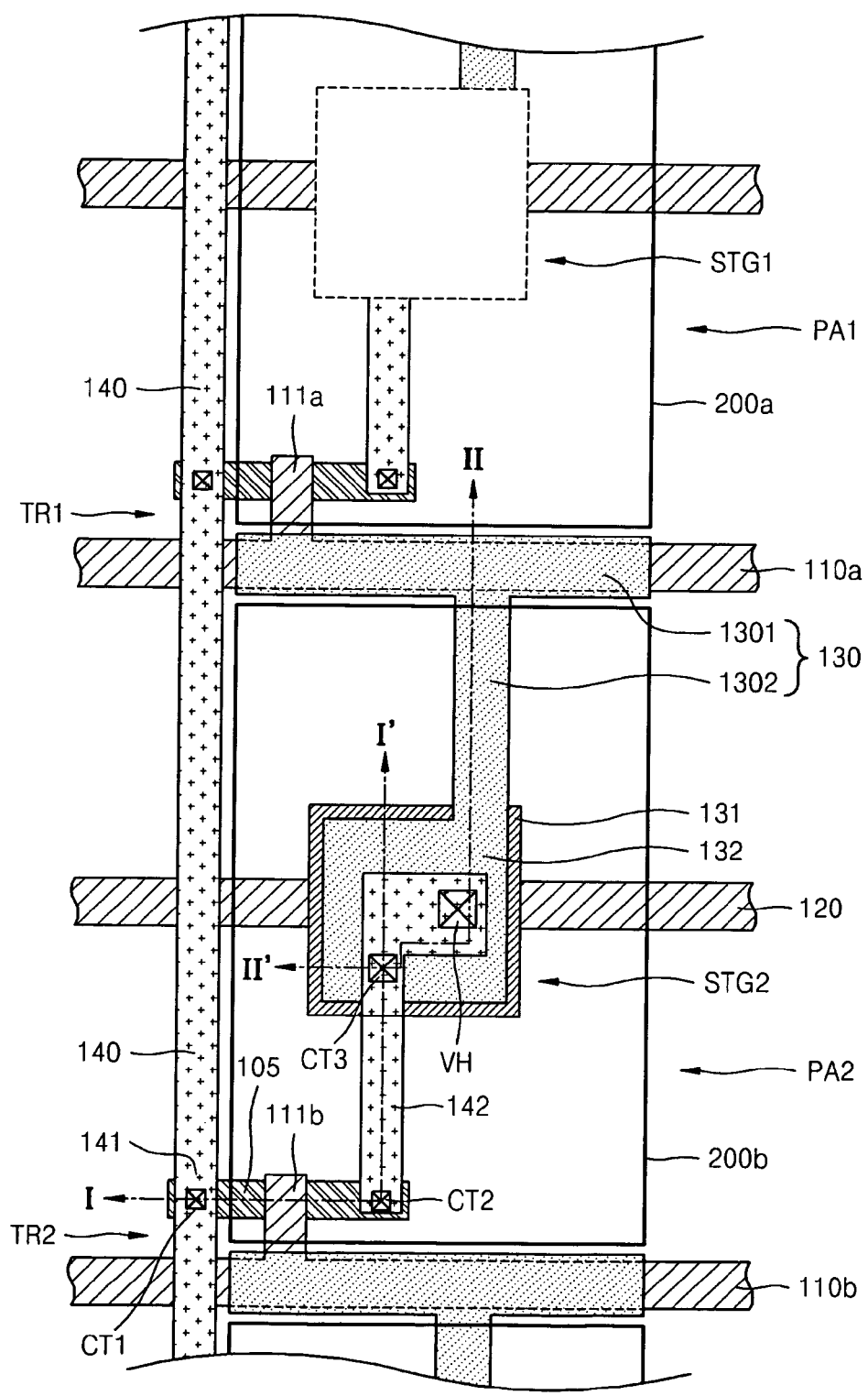
FIG. 1 illustrates a plan view schematically showing a flat panel display apparatus, according to an exemplary embodiment.
Figure 2:
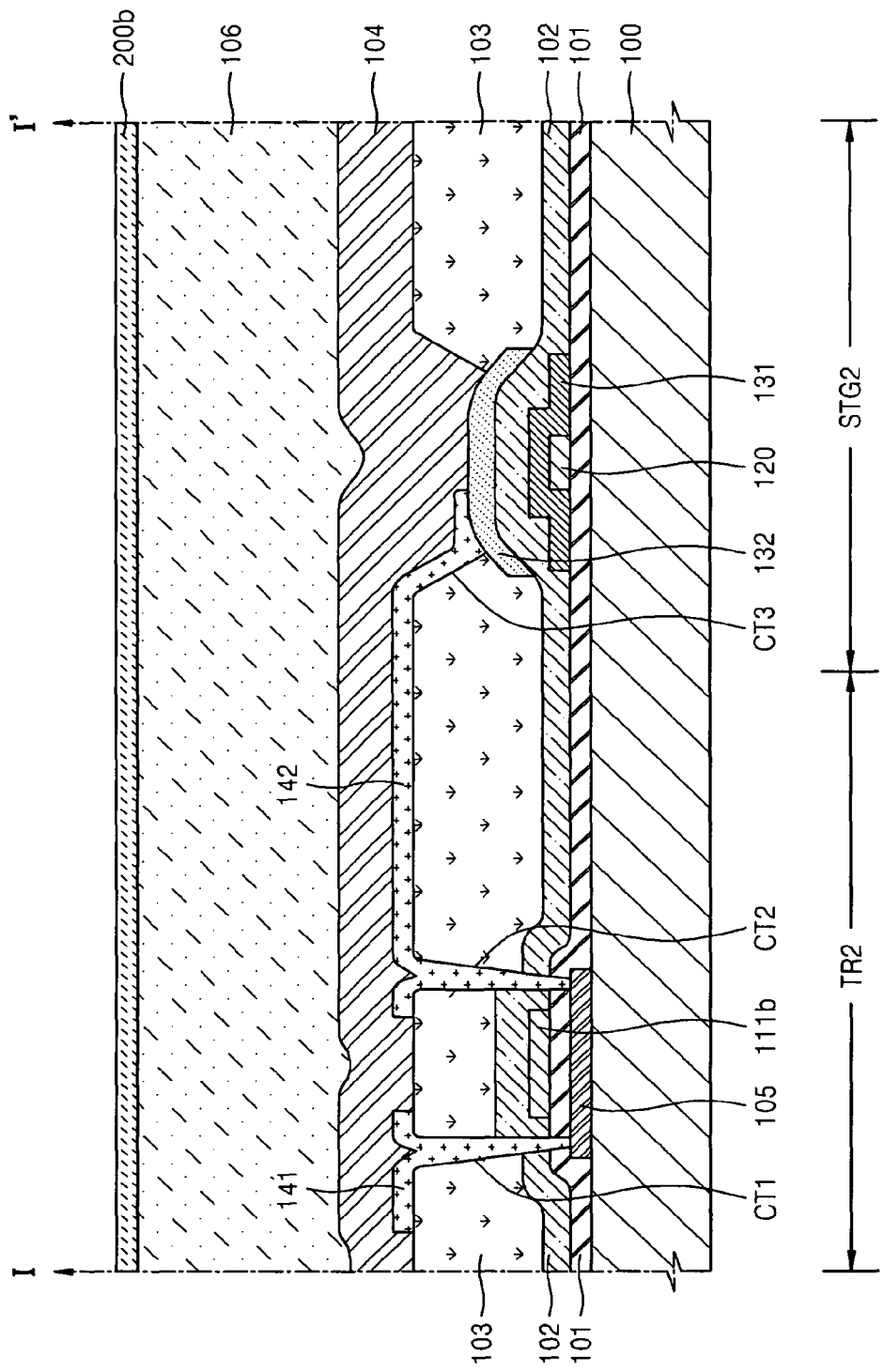
FIG. 2 illustrates a cross-sectional view taken along a line I-I' of FIG. 1.
Figure 3:
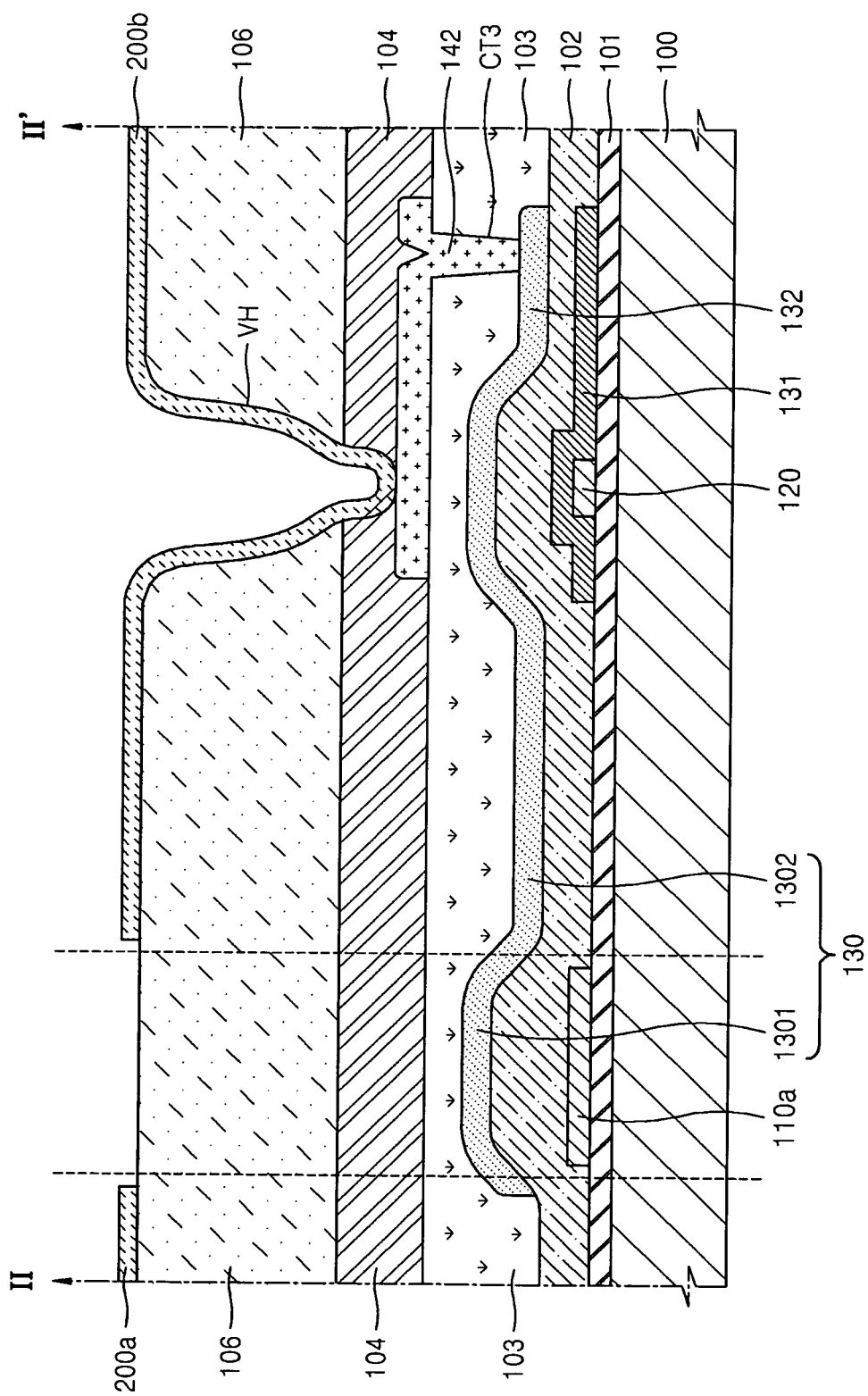
FIG. 3 illustrates a cross-sectional view taken along a line II-II' of FIG. 1.

FIG. 1 illustrates a plane view schematically showing a flat panel display apparatus according to an exemplary embodiment. FIG. 2 illustrates a cross-sectional view taken along a line I-I' of FIG. 1, and FIG. 3 illustrates a cross-sectional view taken along a line II-II' of FIG. 1. A description will now be made with reference to FIGS. 1, 2, and 3.

Referring to FIG. 1, a flat panel display apparatus, according to an exemplary embodiment, may include a plurality of pixel regions. The pixel regions may be defined by gate lines that intersect, e.g., one another and/or data lines on a substrate 100. A first pixel region PA1 and a second pixel region PA2, which may be adjacent to each other with a first gate line 110a therebetween, are illustrated in FIG. 1. For convenience sake, a description will be made using the first pixel region PA1 and the second pixel region PA2 as examples.

The first pixel region PA1, which may be defined by intersection between the first gate line 110a and a data line 140, may include a first transistor TR1 and a first capacitor STG1. The first pixel region PA1 may be covered with a first pixel electrode 200a.

The second pixel region PA2, which may be defined by intersection between a second gate line 110b and the data line 140, may include a second transistor TR2 and a second capacitor STG2. The second pixel region PA2 may be covered with a second pixel electrode 200b.

According to an exemplary embodiment, the first gate line 110a may be disposed between the first pixel electrode 200a and the second pixel electrode 200b. The first gate line 110a may protrude to form a first gate electrode 111a of the first transistor TR1 included in the first pixel region PA1. The second gate line 110b may also be disposed between pixel electrodes.

The first gate line 110a and the second gate line 110b may include one or more conductive materials selected from, e.g., a group consisting of Ag, Mg, Al, Pt, Pd, Au, Ni, Nd, Ir, Cr, Li, Ca, Mo, Ti, W, MoW, Al/Cu, and Cu. For example, the first gate line 110a and the second gate line 110b may be composed of non-transparent metal. The first gate line 110a may be disposed under the first pixel electrode 200a, e.g., the first gate line 110a may overlap with the first pixel electrode 200a, such that the first gate line 110a interrupts a light path, reducing an aperture ratio. However, according to an exemplary embodiment, the first gate line 110a may be arranged between the first pixel electrode 200a and the second pixel electrode 200b, thus improving an aperture ratio. The first pixel electrode 200a may function to shield an electric field of the first gate line 100a, such that there is no structure capable of shielding the electric field generated in the first gate line 110a without disposing the first gate line 110a to overlap with pixel electrodes. To this end, in an exemplary embodiment, a transparent electrode, e.g., of the second capacitor STG2, may be used for electric field shielding, as will be later described in detail.

The first transistor TR1 included in the first pixel region PA1 and the second transistor TR2 included in the second pixel region PA2 may be formed to have the same or similar structures. The following description will be made based on the second transistor TR2 and the second capacitor STG2. To avoid repetitive description, for the first transistor TR1 and the first capacitor STG1, differences in comparison with the second transistor TR2 and the second capacitor STG2 will be described in brief. In addition, in the detailed description, as to components which have the same function while being included in different pixel regions, "first" is added to the component included in the first pixel region PA1 and "second" is added to the component included in the second pixel region PA2 to distinguish them.

One of a source electrode 141 and a drain electrode 142 of the second transistor TR2 may be connected with the second pixel electrode 200b through, e.g., a via-hole VH, and one of the source electrode 141 and the drain electrode 142 of the second transistor TR2 may be connected with the second capacitor STG2. The second transistor TR2 may include a semiconductor layer 105, a second gate electrode 111b, the source electrode 141, and the drain electrode 142. The semiconductor layer 105 may include a channel region, a source region, and a drain region. The second capacitor STG2 may include a capacitor wiring line 120, a first transparent conductive layer 131, and a second transparent conductive layer 132.

The substrate 100 may be formed of a transparent glass material, e.g., having $SiO_2$ as its main component. On the substrate 100 may be further formed a buffer layer (not shown) including, e.g., $SiO_2$ and/or $SiN_x$ to planarize the surface of the substrate 100 and minimize and/or prevent penetration of impurity ions.

The semiconductor layer 105 may be formed of, e.g., an amorphous silicon or a polysilicon. The polysilicon may be formed by crystallizing the amorphous silicon. For the crystallization, various methods such as, e.g., a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, and a like process may be used.

On the semiconductor layer 105 may be formed a first insulating layer 101. The first insulating layer 101 may include a single layer or a plurality of layers formed of, e.g., silicon oxide and/or silicon nitride.

On the first insulating layer 101, the second gate electrode 111b may be formed in a position corresponding to the channel region of the semiconductor layer 105. Referring to FIG. 1, the second gate electrode 111b may be formed as protruding from the second gate line 110b, e.g., as a protruding portion from the second gate line 110b. Thus, the second gate electrode 111b and the second gate line 110b may be formed of the same material and in the same layer.

The second capacitor STG2 may be formed in a position spaced apart from the second transistor TR2. The second capacitor STG2 may include the capacitor wiring line 120 formed on the substrate 100. The capacitor wiring line 120 may be formed of the same material and in the same layer as the second gate electrode 111b. Thus, the capacitor wiring line 120 may include one or more conductive materials selected from, e.g., a group consisting of Ag, Mg, Al, Pt, Pd, Au, Ni, Nd, Ir, Cr, Li, Ca, Mo, Ti, W, MoW, Al/Cu, and Cu.

The second capacitor TR2 may include the first transparent conductive layer 131 as a lower electrode and the second transparent conductive layer 132 as an upper electrode. The electrodes of the second capacitor STG2, according to an exemplary embodiment, may all be composed of a transparent conductive material. For example, the first transparent conductive layer 131 and the second transparent conductive layer 132 may include at least one selected from, e.g., a group consisting of indium tin oxide (ITO), indium zinc oxide (IZO), zinc oxide (ZnO), indium oxide ($In_2O_3$), indium gallium oxide (IGO), and aluminum zinc oxide (AZO). By forming the upper electrode and the lower electrode of the second capacitor TR2 as transparent electrodes, the aperture ratio of the flat panel display apparatus can be improved without reducing the size of the second capacitor TR2.

The first transparent conductive layer 131 may be formed on the capacitor wiring line 120 and may directly contact the capacitor wiring line 120. The upper electrode and the lower electrode of the second capacitor TR2 may be formed as transparent electrodes having high resistivity. When the capacitor wiring line 120 is formed with the transparent electrode having higher resistivity, a voltage supplied to the second capacitor TR2 increases. However, when the capacitor wiring line 120 is formed of the same material having lower resistivity as the above-described material of the second gate electrode 111b, a voltage supplied to the second capacitor TR2 may be reduced. In this regard, in a liquid crystal display (LCD) apparatus, a common voltage Vcom may be separately supplied to a capacitor, and by applying the common voltage Vcom to the capacitor wiring line 120 having low resistivity like in an exemplary embodiment, load caused by a resistance of the capacitor writing line 120 can be minimized.

The second insulating layer 102 may be formed on the second gate electrode 111b of the second transistor TR2 and the first transparent conductive layer 131 of the second capacitor STG2. The second insulating layer 102 may be formed of, but not limited to, the same material as the first insulating layer 101.

In the second capacitor STG2 region, the second conductive layer 132 may be formed to correspond to the first transparent conductive layer 131, with the second insulating layer 102 therebetween. The second transparent conductive layer 132 may extend toward the first pixel region PA1 to overlap with the first gate line 110a. As such, according to an exemplary embodiment, a transparent shielding portion 130 is formed, which may be an extension of the second transparent conductive layer 132 in a direction toward the first pixel region PA1. The transparent shielding portion 130 may extend to overlap the first gate line 110a.

The transparent shielding portion 130 may include a shielding portion 1301 and a connecting portion 1302. The shielding portion 1301 may extend in the same direction as the extending direction of the first gate line 110a and may overlap the first gate line 110a. The connecting portion 1302 may extend in a direction toward the first pixel region PA1 and may connect the shielding portion 1301 with the second transparent conductive layer 132. The transparent shielding portion 130 may be formed of the same material and in the same layer as the second transparent conductive layer 132. For example, the transparent shielding portion 130 may be formed of a transparent conductive material. For example, the transparent shielding portion 130 may include at least one selected from, e.g., a group consisting of indium tin oxide (ITO), indium zinc oxide (IZO), zinc oxide (ZnO), indium oxide (In$_2$O$_3$), indium gallium oxide (IGO), and aluminum zinc oxide (AZO).

Figure 4:
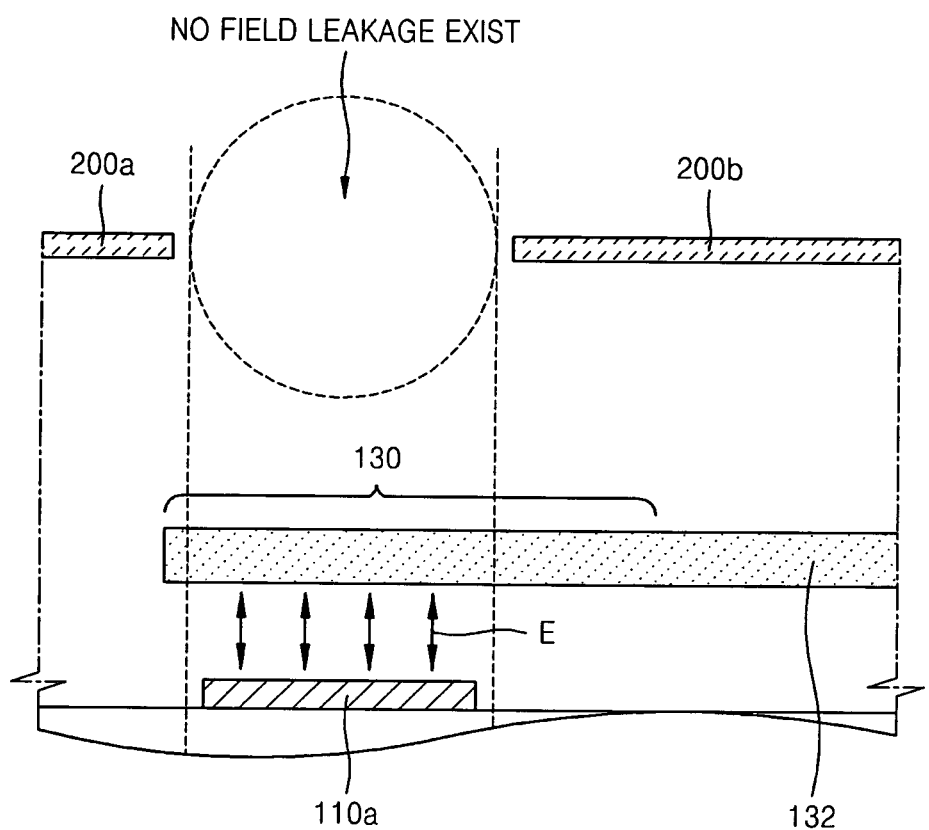
FIG. 4 illustrates a diagram for describing FIG. 3.

FIG. 4 illustrates a diagram for describing FIG. 3.

Referring to FIG. 4, the transparent shielding portion 130 shields an electric field E generated from the first gate line 110a, thereby minimizing and/or preventing the electric field E from leaking to an upper portion. Therefore, although not shown, a liquid crystal layer above the pixel electrodes 200a and 200b may not be affected or may not be substantially affected by the electric field E. As such, according to an exemplary embodiment, electric field shielding as well as aperture ratio improvement can be achieved.

Referring back to FIGS. 1 through 3, a third insulating layer 103 may be formed to cover the second transparent conductive layer 132, e.g., formed to entirely cover the second transparent conductive layer 132. In the second transistor TR2 region, a first contact hole CT1 and a second contact hole CT2 may be formed to pass through the second insulating layer 102 and the third insulating layer 103 formed on the second gate electrode 111b. In the second transistor TR2 region, the source electrode 141 and the drain electrode 142 may be connected to the source region and drain region of the semiconductor layer 105, respectively. In the second capacitor STG2 region, a third contact hole CT3 may be formed to pass through the third insulating layer 103 on the second transparent conductive layer 132, such that one of the source electrode 141 and the drain electrode 142 is connected with the second transparent conductive layer 132. Thus, the second capacitor SGT2 and the second transistor TR2 may be electrically connected and driven.

A fourth insulating layer 104 may be formed on the source electrode 141, the drain electrode 142, and the third insulating layer 103. The fourth insulating layer 104 may be an inorganic insulating layer. However, the shown fourth insulating layer 104 may be excluded.

An organic layer 106, e.g., including the via-hole VH, may be formed on the fourth insulating layer 104 and/or the third insulating layer 103. On the organic layer 106 may be formed the second pixel electrode 200b which is connected with one of the source electrode 141 and the drain electrode 142 through the via-hole VH passing through the organic layer 106. Thus, current may flow through the second pixel electrode 200b.

An opposite electrode (not shown) may be formed to face the second pixel electrode 200b, and a liquid crystal layer (not shown) may be included between the second pixel electrode 200b and the opposite electrode. Such a structure may also be applied to the first pixel electrode 200a.

The first transistor TR1 and the first capacitor STG1 included in the first pixel region PA1 may have the same and/or similar structures and implement the same and/or similar functions as the second transistor TR2 and the second capacitor STG2 included in the second pixel region PA2. For example, a transparent shielding portion may extend from an upper electrode of the first capacitor STG1 to cover a gate line which defines a pixel region of a previous stage.

Figure 5:
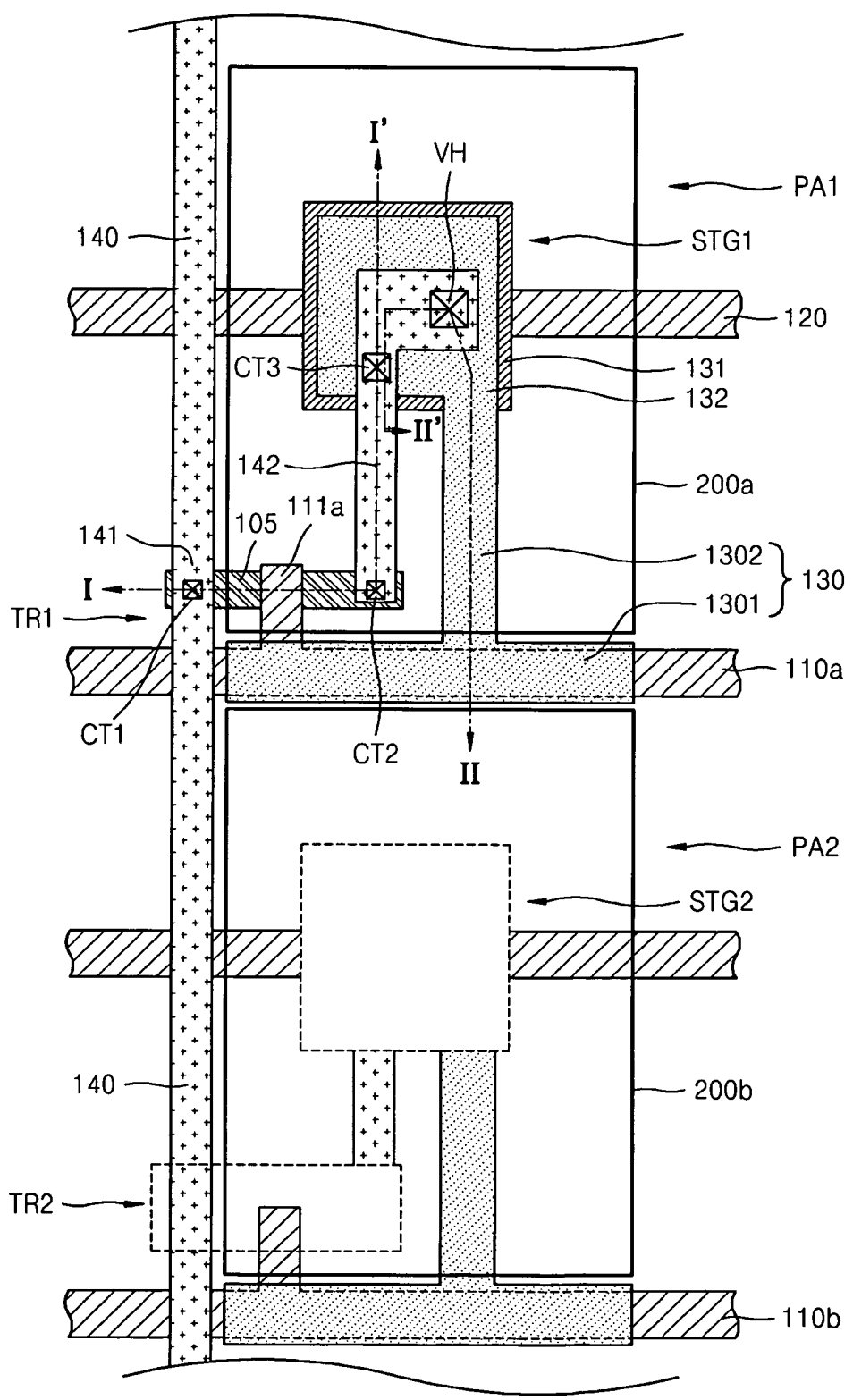
FIG. 5 illustrates a plan view schematically showing a flat panel display apparatus, according to an exemplary embodiment.
Figure 6:
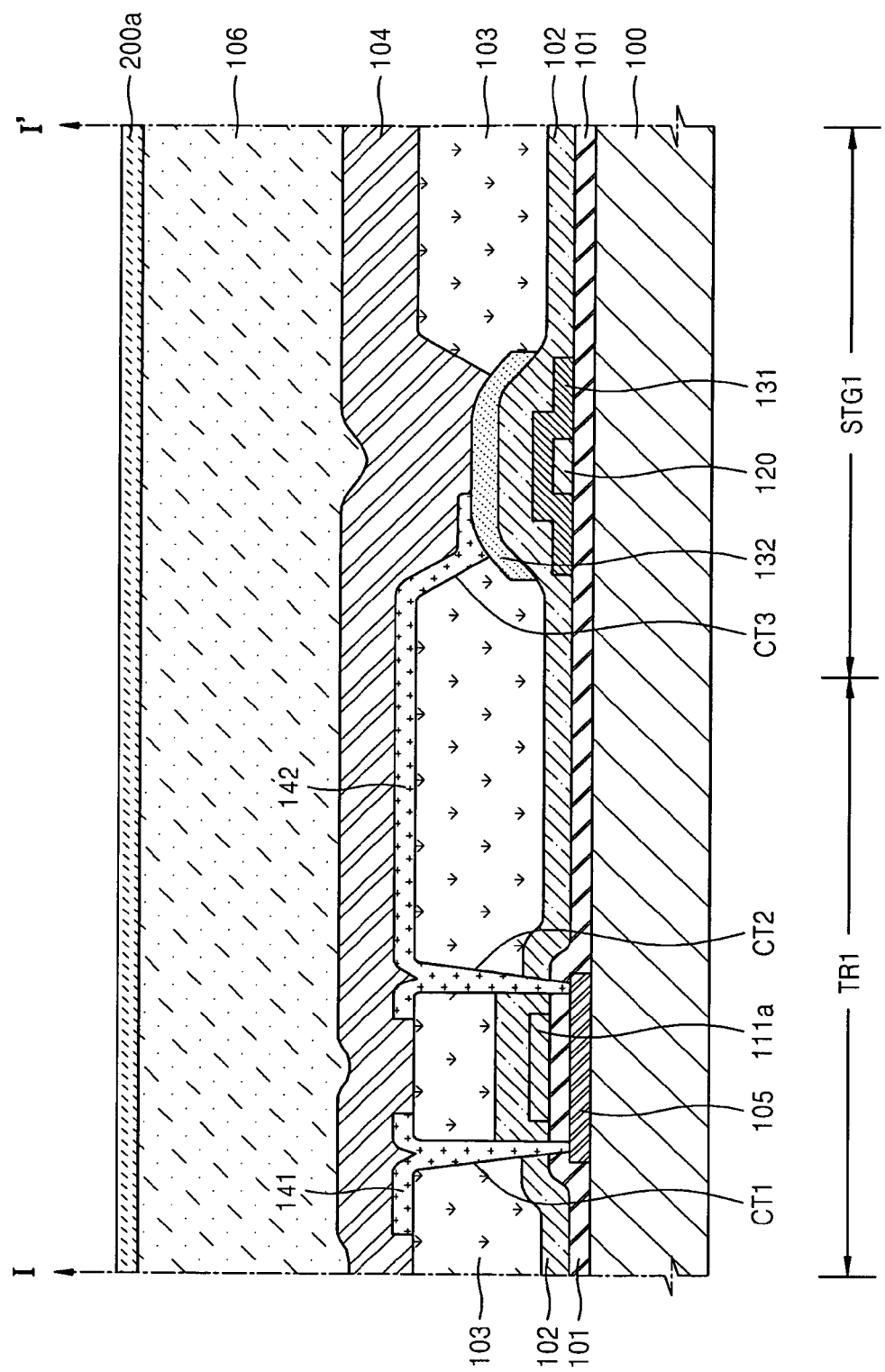
FIG. 6 illustrates a cross-sectional view taken along a line I-I' of FIG. 5.

FIG. 5 illustrates a plane view schematically showing a flat panel display apparatus according to another exemplary embodiment. FIG. 6 illustrates a cross-sectional view taken along a line I-I' of FIG. 5, and FIG. 7 illustrates a cross-sectional view taken along a line II-II' of FIG. 5.

Figure 7:
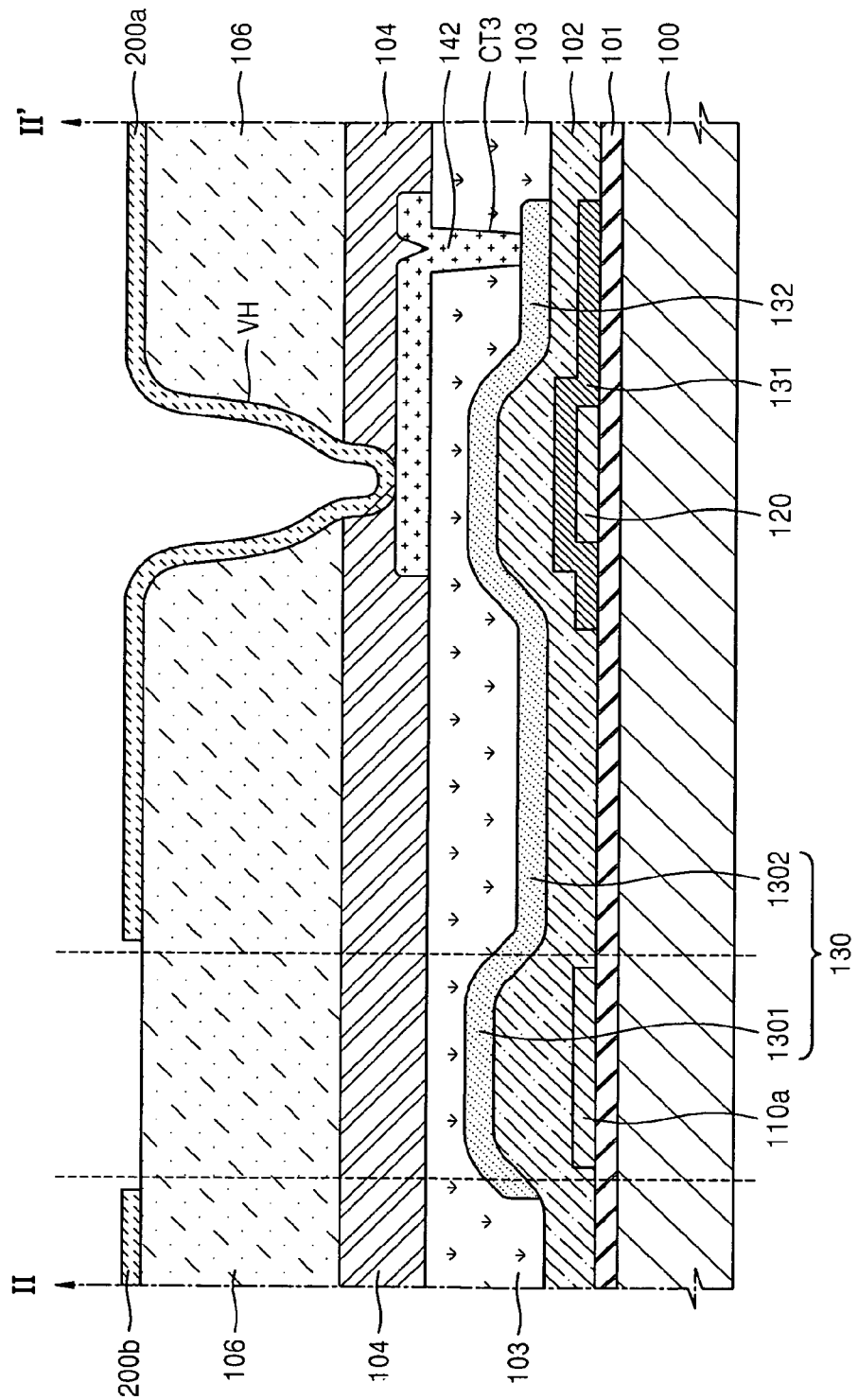
FIG. 7 illustrates a cross-sectional view taken along a line II-II' of FIG. 5.

The flat panel display apparatus according to the exemplary embodiment of shown in FIGS. 5 through 7 may be distinguished from the flat panel display apparatus according to the embodiment illustrated in FIGS. 1 through 3, in that in the first capacitor STG1 included in the first pixel region PA1, the transparent shielding portion 130 extends toward the second pixel region PA2 to cover the first gate line 110a. Other components of each pixel region, effects thereof, and functions thereof may be the same as or similar to those of the flat panel display apparatus shown in FIGS. 1 through 3.

One of the source electrode 141 and the drain electrode 142 of the first transistor TR1 may be connected with the first pixel electrode 200a through, e.g., the via-hole VH. One of the source electrode 141 and the drain electrode 142 of the first transistor TR1 may be connected with the first capacitor STG1. The first transistor TR1 may include the semiconductor layer 105, the source electrode 141, the drain electrode 142, and the first gate electrode 111a formed by protruding from the first gate line 110a. The semiconductor layer 105 may include a channel region, a source region, and a drain region. The first capacitor STG1 may include the capacitor wiring line 120, the first transparent conductive layer 131, and the second transparent conductive layer 132.

On the substrate 100 may be formed the semiconductor layer 105 on which the first insulating layer 101 is formed. On the first insulating layer 101, the first gate electrode 111a may be formed in a position corresponding to the channel region of the semiconductor layer 105. The first gate electrode 111a and the first gate line 110a may be formed of the same material and in the same layer. For example, the first gate electrode 111a and the first gate line 110a may include one or more conductive materials selected from, e.g., a group consisting of Ag, Mg, Al, Pt, Pd, Au, Ni, Nd, Ir, Cr, Li, Ca, Mo, Ti, W, MoW, Al/Cu, and Cu.

The first capacitor STG1 may be formed in a position spaced apart from the first transistor TR1. The capacitor wiring line 120 may be formed in a position on the substrate 100 where the first capacitor STG1 is to be formed. The capacitor wiring line 120 may be formed of the same material and in the same layer as the first gate electrode 111a. For example, the capacitor wiring line 120 may include one or more conductive materials selected from, e.g., a group consisting of Ag, Mg, Al, Pt, Pd, Au, Ni, Nd, Ir, Cr, Li, Ca, Mo, Ti, W, MoW, Al/Cu, and Cu.

The first capacitor STG1 may include the first transparent conductive layer 131 as a lower electrode and the second transparent conductive layer 132 as an upper electrode. The electrodes of the first capacitor STG1, according to an embodiment, may include a transparent conductive material. For example, the transparent conductive material may be at least one selected from a group consisting of indium tin oxide (ITO), indium zinc oxide (IZO), zinc oxide (ZnO), indium oxide (In$_2$O$_3$), indium gallium oxide (IGO), and aluminum zinc oxide (AZO).

The first transparent conductive layer 131 may be formed on the capacitor wiring line 120, e.g., to directly contact the capacitor wiring line 120. As is previously described, a voltage supplied to the capacitor may be reduced from such a structure. A common voltage Vcom may be supplied to the capacitor writing line 120, and because the capacitor wiring line 120 has low resistivity, load caused by resistance of the capacitor wiring line 120 may be minimized.

The second insulating layer 102 may be formed on the first gate electrode 111a and the first transparent conductive layer 131. The second transparent conductive layer 132 may be formed to correspond to the first transparent conductive layer 131, with the second insulating layer 102 therebetween. The second transparent conductive layer 132 may extend toward the second pixel region PA2 to overlap with the first gate line 110a formed between the first pixel region PA1 and the second pixel region PA2. As such, the transparent shielding portion 130 in the second transparent conductive layer 132, according to an exemplary embodiment, may extend toward the second pixel region PA2 to overlap with the first gate line 110a.

The transparent shielding portion 130 may include the shielding portion 1301 and the connecting portion 1302. The shielding portion 1301 may extend in the same direction as the extending direction of the first gate line 110a and may overlap with the first gate line 110a. The connecting portion 1302 may extend toward the second pixel region PA2 and may connect the shielding portion 1301 with the second transparent conductive layer 132. The transparent shielding portion 130 may be formed of the same material and in the same layer as the second transparent conductive layer 132. The transparent shielding portion 130 may shield an electric field generated from the first gate line 110a, thereby minimizing and/or preventing a liquid crystal layer above the pixel electrodes 200a and 200b from being affected or substantially affected by the electric field. Thus, electric field shielding as well as aperture ratio improvement may be achieved.

The third insulating layer 103 may be formed to cover the second transparent conductive layer 132. In the first transistor TR1 region may be formed the source electrode 141 and the drain electrode 142, which may be connected to the source region and the drain region of the semiconductor layer 105 through the first contact hole CT1 and the second contact hole CT2 passing through the second insulating layer 102 and the third insulating layer 103 formed on the first gate electrode 111a. In the first capacitor STG1 region, one of the source region 141 and the drain electrode 142 may be connected with the second transparent conductive layer 132 through the third contact hole CT3 passing through the third insulating layer 103 on the second transparent conductive layer 132.

The fourth insulating layer 104 may be further formed on the source electrode 141, the drain electrode 142, and the third insulating layer 103.

The organic layer 106 including the via-hole VH may be formed on the fourth insulating layer 104 and/or the third insulating layer 103. On the organic layer 106 may be formed the first pixel electrode 200a, which may be connected to one of the source electrode 141 and the drain electrode 142 through the via-hole VH passing through the organic layer 106. Thus, current may flow through the first pixel electrode 200a.

An opposite electrode may be further formed to face the first pixel electrode 200a, and a liquid crystal layer may be included between the first pixel electrode 200a and the opposite electrode.

While an LCD apparatus is disclosed in the drawings, the present invention is not limited to the LCD apparatus and is applicable to various display apparatuses such as light-emitting displays, e.g., organic light-emitting display apparatus.

As discussed above, according to an embodiment, a gate line may be disposed not to overlap with a pixel electrode, thereby improving the aperture ratio of the flat display panel apparatus. Moreover, a transparent electrode of a capacitor, instead of a pixel electrode, may extend to be used for shielding an electric field generated from a gate line, thereby shielding the electric field generated from the gate line, e.g., even in a new structure.

Further, both electrodes of a capacitor may all be used as transparent electrodes, thus improving the aperture ratio of the flat panel display apparatus without reducing the size of the capacitor. A wiring line connected to the capacitor may be formed of the same material as the gate electrode having low resistance, thus reducing the resistance of the wiring line.

By way of summation and review, gate lines may be arranged under pixel electrodes such that, e.g., the pixel electrodes may shield electric fields of the gate lines. However, the gate lines arranged on a light path interrupt light emission reduce an aperture ratio by an amount corresponding to shielding regions. As such, according to an exemplary embodiment, a gate line is arranged in a non-overlapping relationship with a pixel electrode and a transparent electrode of a capacitor is used to shield an electric field, thereby improving an aperture ratio of the flat display apparatus.

Since components illustrated in the drawings may be enlarged or reduced for convenience of explanation, the present embodiments are not limited to the sizes and shapes of the components illustrated in the drawings. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. It will be understood by one of ordinary skill in the art that various changes and other equivalent embodiments are possible. Accordingly, the true technical scope of the present invention should be defined by the technical spirit of the following claims.

What is claimed is:

1. A flat panel display apparatus, comprising:
   a first pixel region on a substrate and defined by an intersection between a first gate line and a data line, the first pixel region including a first transistor and a first capacitor, and the first pixel region being covered by a first pixel electrode;
   a second pixel region adjacent to the first pixel region and defined by an intersection between a second gate line and the data line, the second pixel region being covered by a second pixel electrode;
   the first gate line extending in a first direction, the first gate line being positioned between the first pixel electrode and the second pixel electrode;
   a second capacitor included in the second pixel region, the second capacitor including a first transparent conductive layer and a second transparent conductive layer;
   a transparent shielding portion extending from the second transparent conductive layer of the second capacitor toward the first pixel region, the transparent shielding portion covering two opposite edges of the first gate line between the first pixel electrode and the second pixel electrode; and
   a second transistor in the second pixel region and connected to the second pixel electrode, the second transistor including:
   a semiconductor layer on the substrate, the semiconductor layer including a channel region, a source region, and a drain region,
   a gate electrode on the channel region with a first insulating layer between the gate electrode and the channel region, the gate electrode protruding from the second gate line, and
   a source electrode and a drain electrode of the second transistor connected to the source region and the drain region through a second insulating layer and a third insulating layer on the gate electrode,
   wherein the second capacitor includes a capacitor wiring line formed of a same material and in a same layer as the gate electrode, the capacitor wiring line directly contacting the first transparent conductive layer, and wherein:
the first transparent conductive layer is on the capacitor wiring line,
the second transparent conductive layer corresponds to the first transparent conductive layer, the second insulating layer being between the second transparent conductive layer and the first transparent conductive layer, and
the second transparent conductive layer is connected to one of the source electrode and the drain electrode of the second transistor.

2. The flat panel display apparatus as claimed in claim 1, wherein the transparent shielding portion includes:
a shielding portion extending in a same direction as an extending direction of the first gate line to overlap the first gate line; and
a connecting portion extending toward the first pixel region to connect the shielding portion with the second transparent conductive layer.

3. The flat panel display apparatus as claimed in claim 1, wherein the first transparent conductive layer, the second transparent conductive layer, and the transparent shielding portion include at least one of indium tin oxide (ITO), indium zinc oxide (IZO), zinc oxide (ZnO), indium oxide (In$_2$O$_3$), indium gallium oxide (IGO), and aluminum zinc oxide (AZO).

4. The flat panel display apparatus as claimed in claim 1, further comprising an organic layer between the second pixel electrode and the source and drain electrodes, one of the source electrode and the drain electrode being connected to the second pixel electrode through a via-hole in the organic layer.

5. The flat panel display apparatus as claimed in claim 1, wherein the capacitor wiring line includes a conductive material, the conductive material including at least one of Ag, Mg, Al, Pt, Pd, Au, Ni, Nd, Ir, Cr, Li, Ca, Mo, Ti, W, MoW, Al/Cu, and Cu.

6. The flat panel display apparatus as claimed in claim 1, wherein the first transistor is connected to the first pixel electrode and includes a gate electrode protruding from the first gate line.

7. The flat panel display apparatus as claimed in claim 1, further comprising an opposing electrode facing the first pixel electrode and the second pixel electrode, wherein liquid crystal is between the first and second pixel electrodes and the opposing electrode.

8. The flat panel display apparatus as claimed in claim 7, wherein:
the second capacitor includes a capacitor wiring line formed of a same material and in a same layer as the second gate line, the capacitor wiring line directly contacting the first transparent conductive layer, and
a common voltage is supplied to the capacitor wiring line.

9. A flat panel display apparatus, comprising:
a first pixel region on a substrate and defined by an intersection between a first gate line and a data line, the first pixel region being covered by a first pixel electrode;
a second pixel region adjacent to the first pixel region and defined by an intersection between a second gate line and the data line, the second pixel region being covered by a second pixel electrode;
the first gate line extending in a first direction, the first gate line being positioned between the first pixel electrode and the second pixel electrode;
a first capacitor included in the first pixel region, the first capacitor including a first transparent conductive layer and a second transparent conductive layer;
a transparent shielding portion extending from the second transparent conductive layer of the first capacitor toward the second pixel region, the transparent shielding portion covering two opposite edges of the first gate line between the first pixel electrode and the second pixel electrode; and
a first transistor in the first pixel region and connected to the first pixel electrode, the first transistor including:
a semiconductor layer on the substrate, the semiconductor layer including a channel region, a source region, and a drain region,
a gate electrode on the channel region with a first insulating layer between the gate electrode and the channel region, the gate electrode protruding from the first gate line, and
a source electrode and a drain electrode of the first transistor connected to the source region and the drain region through a second insulating layer and a third insulating layer on the gate electrode,
wherein the first capacitor includes a capacitor wiring line formed of a same material and in a same layer as the gate electrode, the capacitor wiring line directly contacting the first transparent conductive layer, and
wherein:
the first transparent conductive layer is on the capacitor wiring line, and
the second transparent conductive layer corresponds to the first transparent conductive layer, the second insulating layer being between the second transparent conductive layer and the first transparent conductive layer, and
the second transparent conductive layer is connected to one of the source electrode and the drain electrode of the first transistor.

10. The flat panel display apparatus as claimed in claim 9, wherein the transparent shielding portion includes:
a shielding portion extending in a same direction as an extending direction of the first gate line to overlap the first gate line; and
a connecting portion extending toward the second pixel region to connect the shielding portion with the second transparent conductive layer.

11. The flat panel display apparatus as claimed in claim 9, wherein the first transparent conductive layer, the second transparent conductive layer, and the transparent shielding portion include at least one of indium tin oxide (ITO), indium zinc oxide (IZO), zinc oxide (ZnO), indium oxide (In$_2$O$_3$), indium gallium oxide (IGO), and aluminum zinc oxide (AZO).

12. The flat panel display apparatus as claimed in claim 9, further comprising an organic layer between the first pixel electrode and the source and drain electrodes, one of the source electrode and the drain electrode being connected to the first pixel electrode through a via-hole in the organic layer.

13. The flat panel display apparatus as claimed in claim 9, wherein the capacitor wiring line includes a conductive material, the conductive material including at least one of Ag, Mg, Al, Pt, Pd, Au, Ni, Nd, Ir, Cr, Li, Ca, Mo, Ti, W, MoW, Al/Cu, and Cu.

14. The flat panel display apparatus as claimed in claim 9, further comprising an opposing electrode facing the first pixel electrode, wherein liquid crystal is between the first pixel electrode and the opposing electrode.

15. The flat panel display apparatus as claimed in claim 14, wherein:
- the first capacitor includes a capacitor wiring line formed of a same material in a same layer as the first gate line, the capacitor wiring line directly contacting the first transparent conductive layer; and
- a common voltage is supplied to the capacitor wiring line.

* * * * *